United States Patent [19]

Steger

[11] Patent Number: 5,522,131
[45] Date of Patent: Jun. 4, 1996

[54] ELECTROSTATIC CHUCK HAVING A GROOVED SURFACE

[75] Inventor: Robert J. Steger, Cupertino, Calif.

[73] Assignee: Applied Materials, Inc., Santa Clara, Calif.

[21] Appl. No.: 390,148

[22] Filed: Feb. 21, 1995

Related U.S. Application Data

[63] Continuation of Ser. No. 94,640, Jul. 20, 1993, abandoned.

[51] Int. Cl.$^6$ .............................. H02N 13/00; B23Q 3/15
[52] U.S. Cl. .............................. 29/829; 156/277; 279/128; 361/234
[58] Field of Search ............................ 279/128; 361/234; 156/153, 154, 277; 29/825, 829; 269/8

[56] References Cited

U.S. PATENT DOCUMENTS

| | | | |
|---|---|---|---|
| 4,184,188 | 1/1980 | Briglia | 361/234 |
| 4,384,918 | 5/1983 | Abe | 156/643 |
| 4,603,466 | 8/1986 | Morley | 29/569 |
| 4,665,468 | 5/1987 | Dohya | 361/414 |
| 4,771,730 | 9/1988 | Tezuka | 118/723 |

FOREIGN PATENT DOCUMENTS

| | | |
|---|---|---|
| 0397315A2 | 11/1990 | European Pat. Off. . |
| 0452222 | 10/1991 | European Pat. Off. . |
| 60-261377 | 12/1985 | Japan . |
| 61-0056843 | 3/1986 | Japan ........................ 269/8 |
| 62-157752 | 7/1987 | Japan . |
| 63-194345 | 8/1988 | Japan . |
| 1-241839 | 9/1989 | Japan . |
| 4-147642 | 5/1992 | Japan . |
| 5-152425 | 6/1993 | Japan . |
| 2050064 | 12/1980 | United Kingdom . |

*Primary Examiner*—Steven C. Bishop
*Attorney, Agent, or Firm*—Raymond R. Moser, Jr.

[57] ABSTRACT

An electrostatic chuck (113) having grooves (130, 132, 134) to uniformly distribute a heat transfer medium, e.g., a gas, and a method of fabricating such an electrostatic chuck. Specifically, a grooved layer (112) is formed upon a surface (110) of a conventional chuck body (111). Typically, a conventional chuck body contains a substrate (100) having one or more electrodes (104, 106) deposited thereupon and a first layer (108), typically formed of an insulating material, disposed over the electrodes and a surface of the substrate which supports the electrodes. A second layer (112), typically formed of an insulating material, is formed by screen printing a paste of insulating material over a surface of the first layer. The paste is applied in a pattern which includes at least one gap. After curing the paste into a hard layer, the second layer contains the gap or gaps defined by the screen pattern. The combination of the surface of the first layer and the gaps in the second layer define a grooved surface pattern. The second layer supports a workpiece (122) during subsequent workpiece processing. A hole (216) through the substrate and the first layer provides a portal through which a gas can be pumped into the grooves. With this arrangement, the medium promotes substantially uniform heat exchange between the workpiece and the electrostatic chuck.

26 Claims, 5 Drawing Sheets

ELECTROSTATIC CHUCK HAVING A GROOVED SURFACE

CROSS REFERENCE TO RELATED APPLICATION

This application is a continuation of patent application Ser. No. 08/094,640 entitled AN ELECTROSTATIC CHUCK HAVING A GROOVED SURFACE filed on Jul. 20, 1993, now abandoned.

BACKGROUND OF THE DISCLOSURE

1. Field of the Invention

The invention relates to an electrostatic chuck for retaining a workpiece, particularly, such a chuck having a grooved insulating layer which supports the workpiece, and a method of fabricating this chuck.

2. Description of the Background Art

In general, chucks are used in various material processing systems to retain workpieces, such as semiconductor wafers or dielectric substrates, in a mechanically stationary position while such a system processes the workpiece. In particular, during semiconductor wafer processing, chucks are used to position a substrate of semiconductor material within a vacuum chamber while the substrate undergoes one or more process steps for creating integrated circuits on the substrate. As is well known in the art, such process steps include, for example, ion implantation, sputtering, plasma etching, or chemical vapor deposition.

Generally, during processing, the semiconductor wafer is repeatedly heated and cooled while undergoing various process steps. Typically, all of the process steps are accomplished in a vacuum chamber having a relatively high vacuum. Because a vacuum does not provide heat conduction or convection, a vacuum environment provides limited heat transfer from the wafer. Conventionally, to improve heat conduction from the wafer, the wafer rests upon a massive, heat conductive pedestal, typically formed of a metallic material. Additionally, the periphery of the wafer may be mechanically clamped to the pedestal. One or more grooves are often formed in the surface of the pedestal which faces the wafer. These grooves are typically produced in a defined pattern by appropriately machining the surface of the pedestal. To provide a spatially uniform conductive heat transfer from the wafer to the pedestal, a heat transfer medium, typically a gas such as helium, is pumped into the grooves. These grooves act as flow conduits which uniformly distribute the heat transfer medium along the surface of the wafer that faces the pedestal. Such a conductive heat transfer process is commonly referred to as a "gas assisted heat transfer". Such gas assisted heat transfer is disclosed by Tsui in European published patent application Ser. No. 0,397,315, and which is incorporated herein by reference.

Gas assisted heat transfer between a workpiece and a pedestal usually relies upon equipment which mechanically clamps a wafer to a pedestal, i.e., a mechanical chuck. Such a mechanical chuck is disclosed by Morley in U.S. Pat. No. 4,603,466, and which is incorporated herein by reference. Specifically, this chuck mechanically clamps a wafer about its periphery to a dome shaped plate (pedestal). Ports are provided through the plate to introduce a gas to an interstitial space between the pedestal and the wafer. A machined annular groove extends about the periphery of the pedestal surface. This groove is connected to a vacuum pump to remove the gas from the interstitial space to minimize possible gas leakage from the interstitial space into the vacuum environment in which the wafer is contained.

In an effort to produce equipment which can retain a workpiece without grasping or clamping the workpiece, i.e., without using a mechanical chuck, the art has developed so-called electrostatic chucks. An example of an electrostatic chuck is disclosed by Briglia in U.S. Pat. No. 4,184,188, which is also incorporated herein by reference. An electrostatic chuck retains a workpiece, such as a semiconductor wafer, by generating a charge differential between a surface of the wafer and one or more electrodes located within the body of the chuck. The ensuing electrostatic force developed between the wafer and the electrodes retains the wafer against the chuck body. The electrodes are typically insulated from the wafer by a relatively thin layer or film of insulating or dielectric material (hereinafter the dielectric layer). As such, the dielectric layer provides a surface upon which the electrostatic force retains the wafer. There are many well known techniques for generating the electrostatic force in an electrostatic chuck, all of which are not relevant here.

For various reasons, including facilitating easy removal of the wafer from the chuck body after processing, the surface of the dielectric layer may be molded or shaped. In particular, as described in Japanese Laid-Open patent application number 60-261377 published on Dec. 24, 1985, the surface of the dielectric layer against which the wafer is retained may contain an embossed pattern of protrusions which support the wafer. Alternatively, as described in Japanese Laid-Open patent application number 63-194345 published on Aug. 11, 1988, strips of a rubber material may be positioned between the dielectric layer and the wafer to provide spatially periodic wafer support.

As with the mechanical chuck, pumping a heat conductive medium between the wafer and the electrostatic chuck would facilitate improved heat conduction from the wafer to the chuck. However, in the past, no economical techniques were available for producing grooves in a dielectric layer. As a result, electrostatic chucks generally do not have gas assisted cooling. In particular, neither of the periodic support structures described in Japanese Laid-Open application numbers 63-194345 and 60-261377 and discussed above contains channels or grooves through which a heat transfer medium could be pumped. Additionally, as discussed below, various methods have been used in an attempt to produce grooves in the surface of a chuck body. However, such methods have proved economically unfeasible.

One such technique for producing grooves in a dielectric surface involved machining the grooves into the surface. Unfortunately, this proved to be considerably difficult. In particular, when a relatively thin dielectric layer was machined to form such grooves, that layer tended to fracture or chip; thus, rendering the entire chuck body useless. Additionally, this machining was a relatively slow process that added excessive labor costs to the manufacturing cost of the chuck as well as resulted in low yields.

Another technique for producing grooves in an otherwise smooth surface of a dielectric layer use a die to emboss a groove pattern into the dielectric layer before hardening the layer. However, when an embossed layer, typically formed of a relatively thick layer of ceramic material, was hardened by firing, the ceramic material shrank in a non-uniform manner. As such, dimensions of an embossed pattern tended to change substantially, thereby producing what is commonly referred to as "dimensional shift". Dimensional shift often resulted in non-uniform grooves. Consequently, when a heat transfer medium was pumped into the grooves, the medium was non-uniformly distributed. As a result, a wafer used in conjunction with such a chuck tended to exhibit non-uniform cooling. This, in turn, unfortunately caused detrimental effects, such as wafer warping, during subsequent processing. Additionally, only a limited number of dielectric materials have the viscosity allowing them to be embossed. This, in turn, by limiting the selection of useful materials, restricted the range of dielectric coefficients that could be achieved. Therefore, embossing was not generally favored as a technique for producing such grooves in the surface of a chuck body.

Therefore, a need exists in the art for a practical method of producing an electrostatic chuck having heat transfer medium distribution grooves in a surface of a dielectric layer that forms a portion of the chuck. This method should produce grooves of substantially uniform dimensions. Advantageously, an electrostatic chuck formed by such a method would, when used during wafer processing, successfully facilitate use of gas assisted heat transfer.

SUMMARY OF THE INVENTION

A chuck body contains a substrate having one or more electrodes deposited thereupon and a layer of insulating material (a "dielectric layer") disposed over both the electrodes and a surface of the substrate which supports the electrodes. Generally, the dielectric layer has a relatively smooth surface facing away from the electrodes which is conventionally used to support a semiconductor wafer during subsequent processing.

A relatively thin layer of insulating material is produced by screen printing an insulating material paste over the smooth surface of the dielectric layer. The paste is applied in a pattern which includes at least one gap. After firing to harden the paste into a patterned layer, the patterned layer contains the gap(s) defined by the screen pattern.

The combination of the dielectric layer and the patterned layer form a composite insulating layer having a grooved surface. Specifically, each groove in the composite layer has a bottom defined by the surface of the dielectric layer and sides defined by the gap formed in the patterned layer. The grooved surface is used to support a workpiece, e.g., a wafer, during subsequent processing.

A hole produced through the substrate and the composite layer provides a portal through which a heat transfer medium, e.g., a gas, can be pumped into the grooves. Consequently, the medium promotes conductive heat exchange between the workpiece and the composite insulating layer.

BRIEF DESCRIPTION OF THE DRAWINGS

The teachings of the present invention can be readily understood by considering the following detailed description in conjunction with the accompanying drawings, in which.

DETAILED DESCRIPTION

My invention can be readily utilized in various conventional types of electrostatic chuck equipment, such as the Precision 5000 manufactured by Applied Materials, Inc. of Santa Clara, Calif. In particular, my inventive chuck is useful in any type of electrostatic chuck equipment capable of gas assisted heat transfer.

FIGS. 1A–1E depict side cross-sectional views of an electrostatic chuck after each process step in my inventive method of fabricating the chuck. To best understand the following discussion, the reader should simultaneously refer to FIGS. 1A–1E. Though my inventive method can be used to form a grooved layer by applying the patterned layer to a previously fabricated chuck body, the following discussion will discuss my method in the context of fabricating an illustrative chuck body.

Figure 1A:
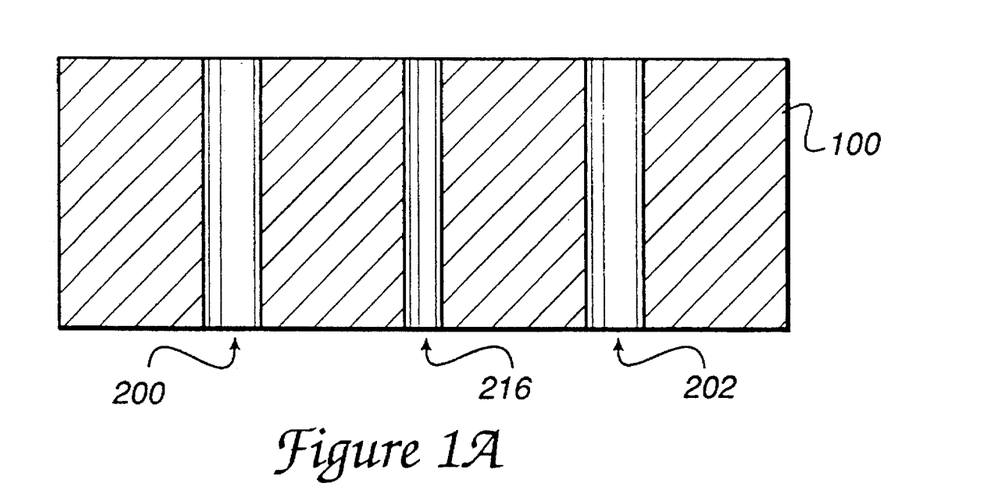
FIGS. 1A–1E successively show side cross-sectional views of an electrostatic chuck that results after each process step in my inventive method of fabricating the chuck.

In particular, fabrication of one embodiment of the electrostatic chuck begins by forming a conventional, generally cylindrical chuck body 111. The chuck body 111 contains a ceramic substrate 100, electrodes 104 and 106, and a dielectric layer 108. Typically, the substrate 100 is a layer of high purity alumina having an approximate thickness of 2.5 to 5 mm. Such an alumina layer provides a strong, cost effective substrate upon which to fabricate an electrostatic chuck. Additionally, alumina provides a substantially flat and smooth surface upon which electrodes can be uniformly deposited. Moreover, alumina has a relatively high dielectric constant which results in a relatively low radio frequency (rf) impedance. A low rf impedance of the substrate is important for producing adequate electrostatic force between a semiconductor wafer and the chuck.

Holes 200, 202 and 216 are formed in the substrate to provide access to the various layers which are subsequently formed upon the substrate. Typically, the holes are formed either with a diamond tipped tool, e.g., a drill or grinding bit, or a vibrating tool and grinding grit. The specific nature and use of these holes are discussed below with respect to FIGS. 2 and 3.

Figure 1B:
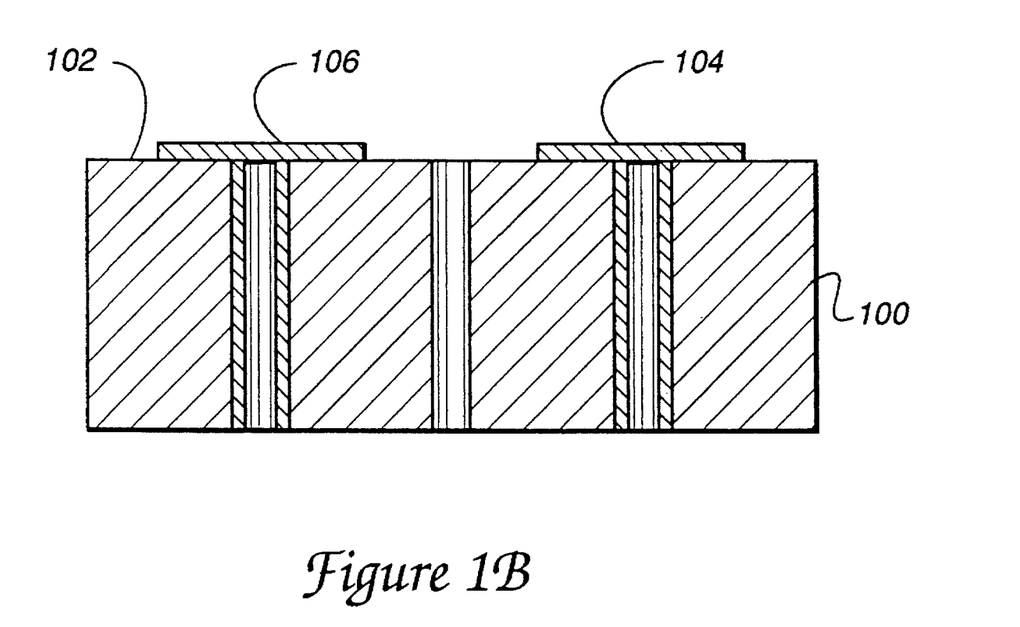
Figure 3:
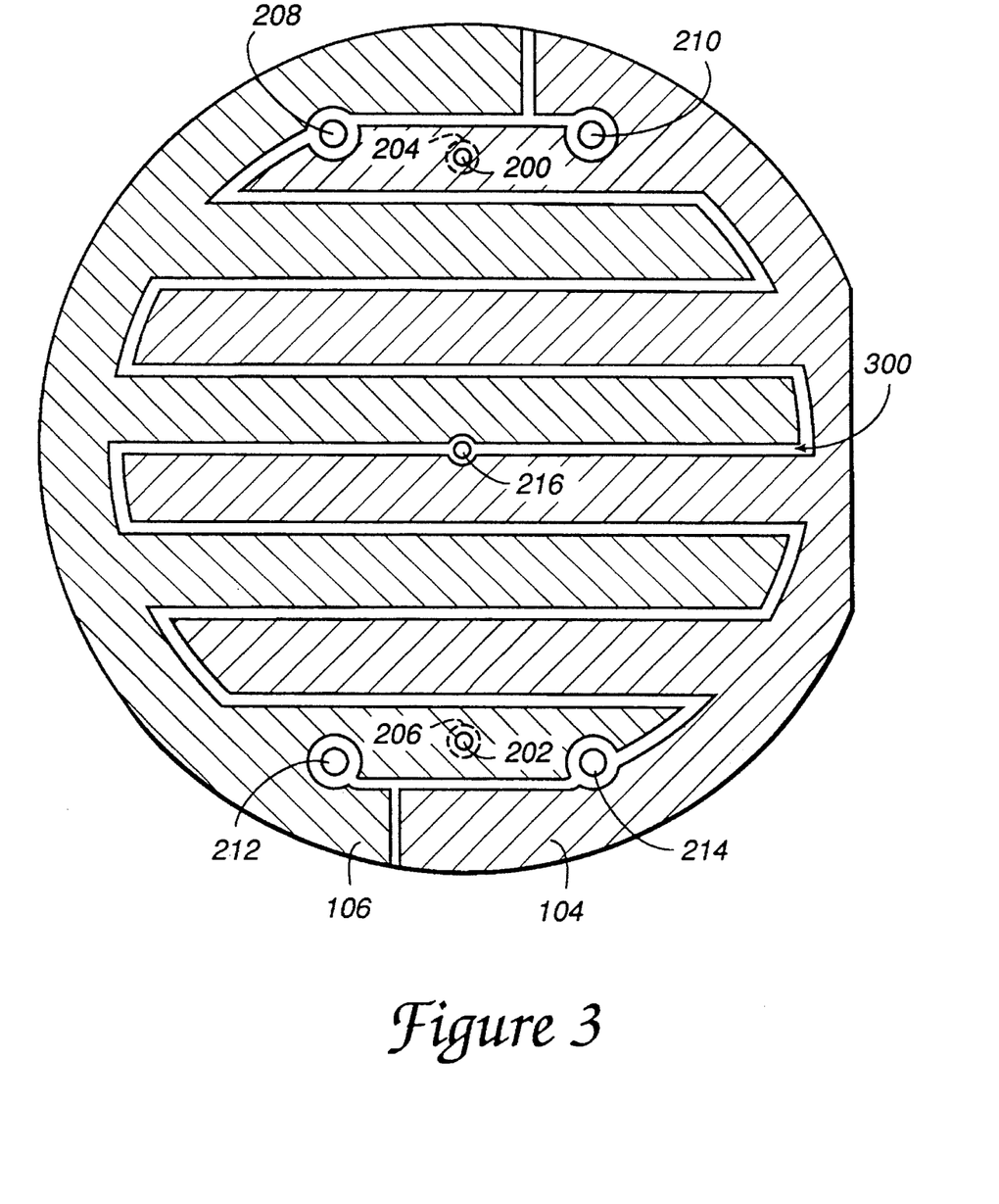
FIG. 3 depicts a plan view of an illustrative electrode pattern for electrodes 104 and 106 shown in FIG. 1B.

One or more electrodes are formed upon surface 102 of the substrate 100 using well known thick-film deposition techniques. The electrodes are usually fabricated from silver; however, other suitable materials that can be used include palladium/silver alloys, molybdenum/magnesium alloys and tungsten. Illustratively, FIG. 1B depicts the two electrodes 104 and 106. Typically, the two electrodes are formed in an interdigital finger pattern. An illustrative interdigital pattern is depicted in FIG. 3 and discussed below. The technique used to generate the electrostatic force to retain the workpiece generally defines the number and pattern of the electrodes. Any such electrode pattern or number of electrodes may be used in conjunction with my invention. In fact, to produce a simple form of chuck body, the substrate 100 and the electrodes 104 and 106 can be replaced with a single metal electrode, e.g., a flat tungsten member.

Figure 1C:
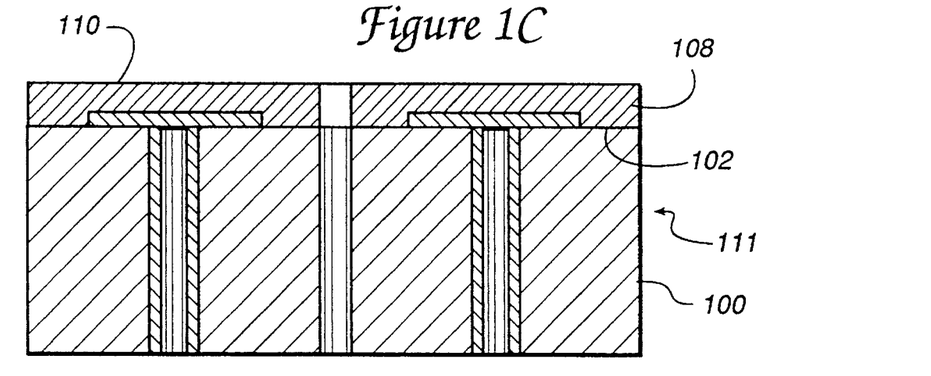

As shown in FIG. 1C, to complete the chuck body, a dielectric layer 108 is deposited upon both the substrate and the electrodes. Typically, the dielectric layer is fabricated by applying a paste of dielectric material to the surface of the substrate. The paste may be applied in any one of the many methods commonly known in the art, including screen printing. Such dielectric material pastes are commonly known in the art as screen printable dielectric inks or pastes. These pastes generally comprise various combinations of glass and ceramic materials in a binding solution. One such dielectric material that can be applied in this fashion is "Dielectric Crossover Type-1000" manufactured by Transene, Inc. of Rowley, Massachusetts. Alternatively, the layer can be formed of an insulating material such as polyimide.

Once the dielectric paste is applied, the entire chuck body is then dried at approximately 120° C. to remove a solvent from the paste that controls paste viscosity. Subsequently, the dried paste is fired at approximately 500° to 575° C. until the dried paste forms a hard dielectric layer. The resulting layer has a smooth, flat surface and an approximate thickness of 150 to 500 vm.

My inventive method adds a patterned layer of insulating material to the conventional chuck body 111. The patterned layer is disposed over the surface of the dielectric layer within the chuck body. The combination of the patterned layer and the dielectric layer forms a composite layer having a surface with grooves therein. These grooves are defined by sides produced by the gap(s) in the patterned layer and a bottom produced by the surface of the dielectric layer.

Figure 1D:
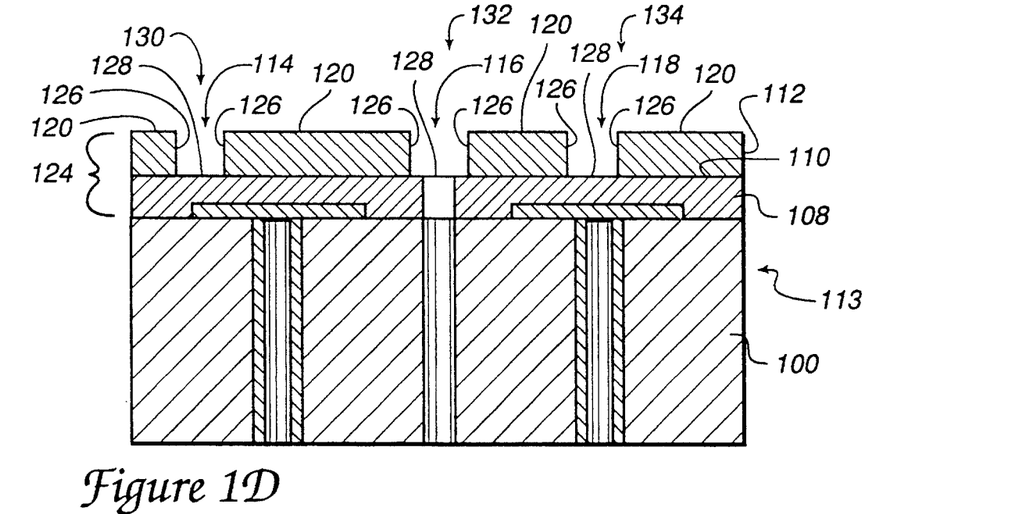

Specifically, FIG. 1D depicts a resulting chuck 113 after the patterned layer 112 is deposited upon a surface 110 of the dielectric layer 108. Surface 110 is considered the surface of the chuck body. The patterned layer is deposited using a screen printing process that permits a pattern of gaps to be produced in the insulating layer. Typically, the screen printing process uses a 120 to 220 mesh screen. A specific pattern of gaps is drawn upon the screen; a blocking polymer is then deposited upon the screen and hardened in areas of the screen where gaps are desired. The screen is typically supported by a frame that maintains the screen at approximately a 0.5 mm distance above the dielectric layer. Once the screen is positioned above the dielectric layer, an insulating material paste, generally known in the art as a screen printable dielectric ink or paste, is spread over the screen. Illustratively, the insulating material may be the same as that used to form the dielectric layer 108, e.g., "Dielectric Crossover Type-1000" However, the insulating material can be different from the material used to form the dielectric layer 108. Typically, the type of material chosen depends on the dielectric constant and insulating characteristics desired for the chuck. Therefore, the material selection is a design choice made when the specific application for the chuck is known.

After the paste is applied, the screen is removed leaving a pattern of paste upon the dielectric layer, i.e., the paste adheres to the dielectric layer in the areas of the screen which do not contain the blocking polymer. The paste is dried at approximately 120° C. to remove a solvent from the paste that is used to control the paste viscosity. Subsequently, the dried paste is fired at approximately 500° to 575° C. until the paste hardens into an insulating patterned layer. The resulting layer has a pattern of gaps formed by the portions of the screen containing the blocking polymer. Because the paste is applied in a relatively thin layer, e.g., approximately 20 mils, the hardening process uniformly hardens the patterned layer without causing significant dimensional shift.

Illustratively, FIG. 1D depicts the chuck 113 having gaps 114, 116 and 118 in the patterned layer 112. The patterned layer 112 and the dielectric layer 108, in combination, form composite layer 124, containing grooves 130, 132 and 134. Each groove has a bottom 128 defined by the surface 110 of the dielectric layer 108 and sides 126 defined by the gaps 114, 116 and 118.

As a final step in my inventive method, the entire top surface, i.e., surface 120, of the patterned layer 112 is ground such that the overall chuck has a predetermined degree of flatness, e.g., within 50 vm. The grinding is accomplished using alumina or some other fine powder in a grinding slurry. After grinding, the insulating layer has an approximate thickness of 50 vm. Consequently, the composite layer has an approximate thickness of 200 to 550 vm.

Figure 1E:
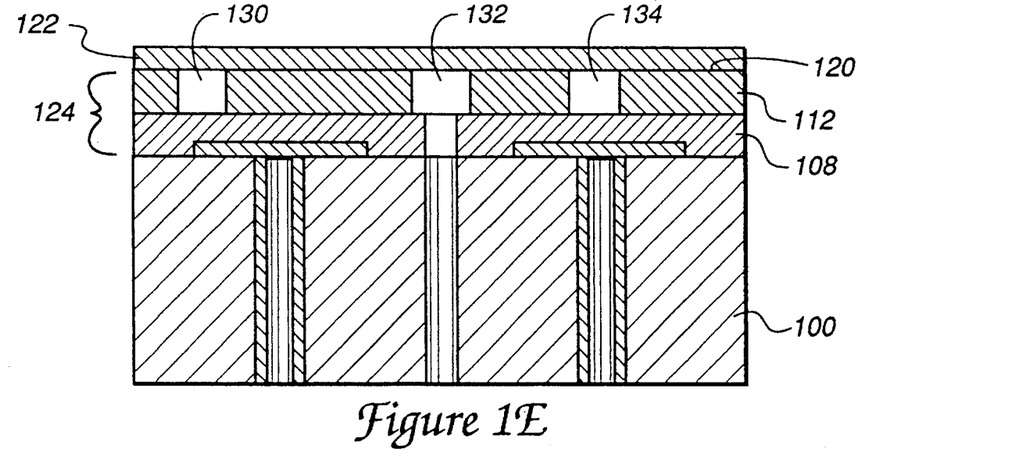

As shown in FIG. 1E, when a workpiece such as a semiconductor wafer 122 is retained against the patterned layer 112 by an electrostatic force between the wafer and the electrodes, grooves 130, 132 and 134 form channels through which a heat transfer medium, such as helium gas, can pass. As such, the gas assists in conducting heat from the wafer to the chuck body during wafer processing. The amount of heat conducted by an electrostatic chuck having a gas assisted heat transfer capability is significantly greater than the amount of heat typically conducted by a conventional electrostatic chuck operating in a vacuum. Conventional chucks are capable of less than 10 mW/cm$^2$C.° of thermal conductivity, while my inventive chuck produces 60 mW/cm$^2$C.° of thermal conductivity when the grooves are filled with helium gas at a 20 torr pressure.

Figure 2:
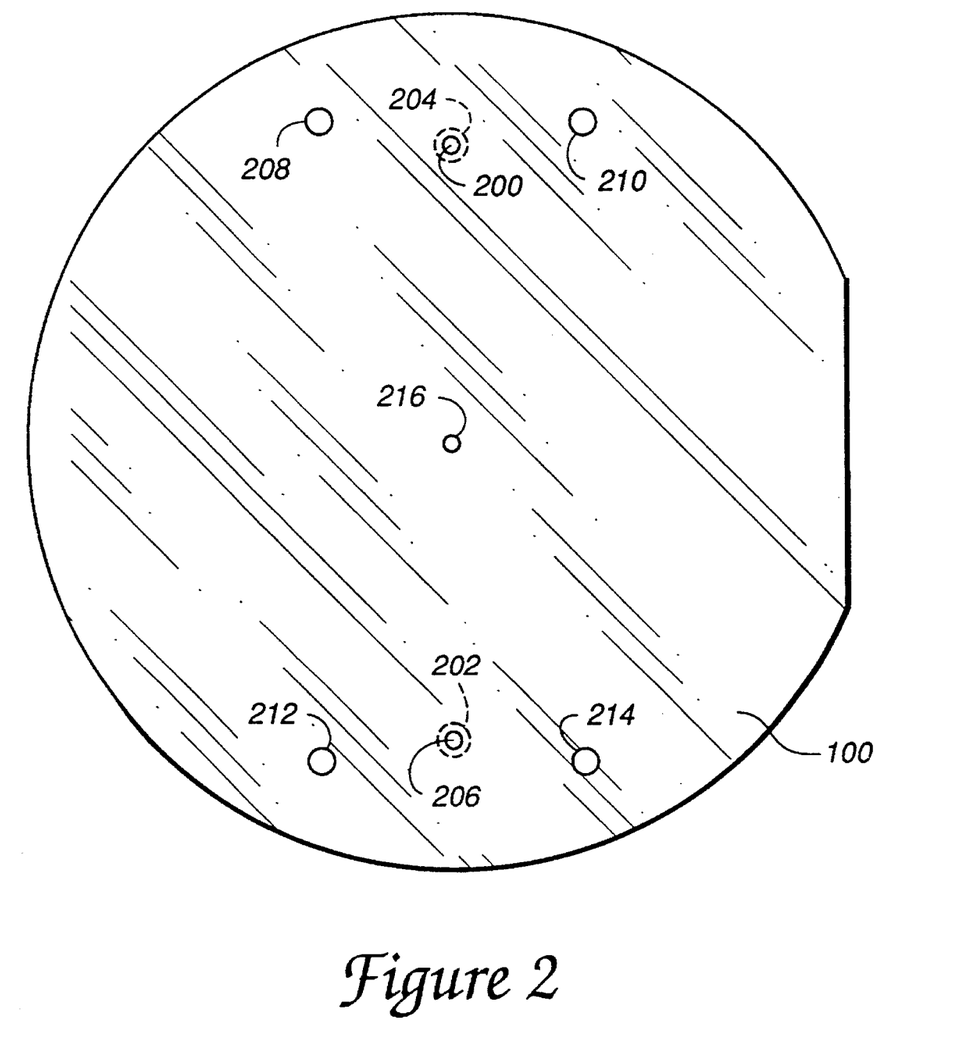
FIG. 2 depicts a plan view of substrate 100 shown in FIG. 1A.

FIG. 2 depicts a plan view of the substrate 100 that forms a portion of the conventional chuck body. The substrate contains holes 200 and 202 which provide an electrically conductive path to the electrodes 104 and 106. Specifically, each of these holes, e.g., holes 200 and 202, respectively, contain contact bushings 204 and 206. As is well known in the art, each contact bushing lines its respective hole with a conductive material, such as silver or tungsten. When the electrodes are deposited upon the substrate, the electrode material bonds with each bushing; hence, the bushings form a conductive path through the substrate to the electrodes. A hole through each bushing provides a location into which a conductive wire (not shown) can be soldered beneath the chuck substrate such that voltage may be applied to the electrodes.

Additionally, the substrate 100 contains four wafer lift pin holes 208, 210, 212 and 214. These holes provide access for pins used to mechanically separate the wafer from the electrostatic chuck after the wafer has been fully processed. Also, a centrally located hole 216 provides a conduit through which a heat transfer medium can be supplied to the grooves.

FIG. 3 depicts a plan view of a typical electrode pattern used in a conventional chuck body. Illustratively, the electrode pattern contains two interdigital electrodes 104 and 106 separated by a gap 300 of approximately 2 mm. Each electrode is connected to a particular contact bushing. In particular, contact bushing 204 in hole 200 connects to electrode 104 and contact bushing 206 in hole 202 connects to electrode 106. The holes 208, 210, 212, 214 and 216 are each provided access through the electrode pattern. Wafer lift pin holes 208, 210, 212 and 214 extend through the patterned layer as well as the underlying chuck body. Typically, the holes through the chuck body substrate are formed by drilling or grinding, while the holes through the composite layer are formed during the silk screening process used to form that layer.

Figure 4:
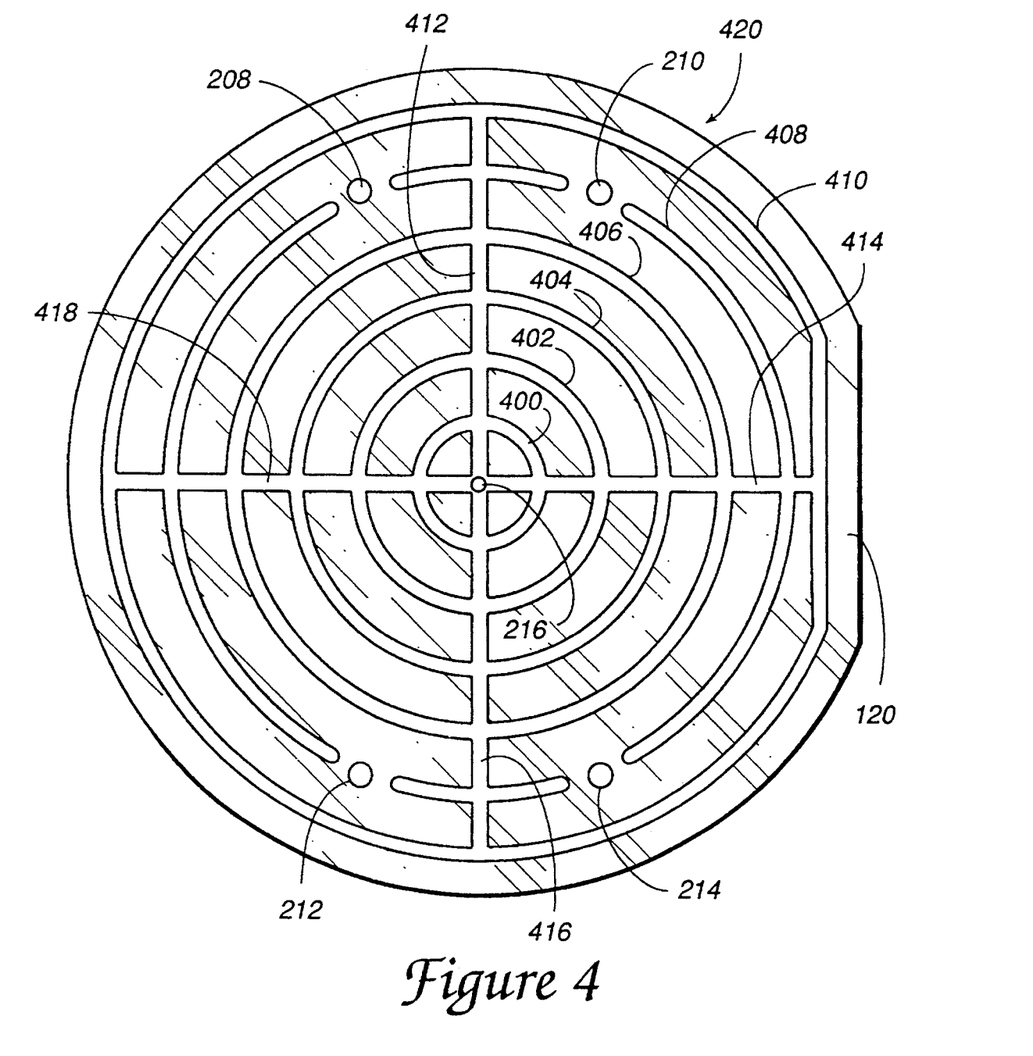
FIG. 4 depicts a plan view of an illustrative pattern of grooves 420 formed in the surface of an electrostatic chuck for uniformly distributing a heat transfer medium adjacent a surface of a workpiece.

FIG. 4 depicts a plan view of an illustrative pattern of grooves 420 in the composite layer 124 contained in the surface of an electrostatic chuck fabricated in accordance with my invention. To uniformly distribute a heat transfer medium pumped, via the hole 216, into the groove pattern, this pattern contains a plurality of circular grooves 400, 402, 404, 406, 408 and 410, all concentric about the hole 216. Each circular groove is interconnected to one another by a plurality of radially extending grooves 412, 414, 416 and 418. Each groove, radial and concentric, has a width of approximately 0.2 to 2 mm. Such a pattern and groove width enables the grooves to be quickly, e.g., in less than fifteen seconds, pressurized to approximately 20 torr. The depicted pattern is illustrative and that other groove patterns may be implemented to achieve various heat transfer characteristics, such as placing more concentric grooves near the center of the wafer than near the periphery to cool the center of the wafer more quickly than the periphery.

The foregoing discussion presented my inventive method in the context of producing an entire electrostatic chuck. Alternatively, my inventive method can be used to improve an existing chuck body by adding a patterned layer thereto. For example, existing chuck bodies have a general form of conventional chuck body 111 shown in FIG. 1C. Specifically, as previously discussed, a conventional chuck body typically contains a substrate supporting one or more electrodes and a dielectric layer disposed over both the electrodes and the substrate. My inventive method adds to such a conventional chuck body a patterned layer using the method described above. Specifically, the patterned layer is screen printed upon the chuck body. As such, gaps in the patterned layer define sides of grooves and the surface of the chuck body defines the bottom of the grooves. The chuck body must then be adapted to enable a heat transfer medium to be pumped into the grooves. Such adaptation occurs by forming, typically by drilling, a hole through the chuck body such that the hole forms a portal through the substrate, electrodes and dielectric layer to the grooves.

When my inventive method is to be applied to an existing chuck body, the chuck body must contain a layer (dielectric layer) of insulating material over the electrodes. That layer should have a relatively smooth surface upon which the patterned layer can be applied. If, for some reason, the existing chuck body does not contain a dielectric layer, then such layer must be applied prior to forming the grooves in accordance with my invention. A screening process can be used to produce the needed dielectric layer over the electrodes. Subsequently, the patterned layer can be added to this dielectric layer to create the grooves.

Whether my inventive method is used to produce an entire electrostatic chuck or to improve an existing chuck body, the result is an inventive electrostatic chuck having grooves to facilitate gas assisted heat transfer. In operation, a workpiece is centered upon my inventive electrostatic chuck and the chuck is energized using well known equipment to produce an electrostatic force. As such, the electrostatic force retains the workpiece against the composite layer of the chuck. A gas, such as helium, is then pumped through the centrally located conduit and into the grooves. The grooves facilitate uniform distribution of the gas between the workpiece and the chuck. The uniformly distributed gas enhances the thermal conductivity from the workpiece to the chuck.

Although one embodiment incorporating the teachings of the present invention has been shown and described in detail herein, those skilled in the art can readily devise many other varied embodiments that still incorporate these teachings.

I claim:

1. A method of fabricating an electrostatic chuck for retaining a workpiece, wherein said chuck contains a grooved surface, said method comprising the steps of:

forming, upon a surface of a chuck body, a layer of an insulating material in a predetermined pattern having a lateral gap;

hardening the layer to form an insulating layer having a groove defined by said gap and said surface of said chuck body.

2. The method of claim 1 wherein said forming step further comprises the steps of screen printing said layer to form a pattern of lateral gaps and curing said layer to form a pattern of grooves defined by said gaps and said surface of said chuck body.

3. The method of claim 2 further comprising the step of providing a passageway through said chuck body to said grooves such that a heat transfer medium can be pumped into said grooves.

4. The method of claim 3 wherein said chuck body comprises a substrate having a surface that supports an electrode and a dielectric layer disposed upon said electrode and said surface, said dielectric layer having a surface facing away from said electrode that is the surface of the chuck body.

5. A method of fabricating an electrostatic chuck for retaining a workpiece, wherein said chuck has a grooved surface, said method comprising the steps of:

depositing an electrode upon a surface of a substrate;

forming a first layer of a first insulating material over said electrode and said substrate surface, wherein said first layer has a surface; and forming, upon said surface of said first layer, a second layer of a second insulating material in a predetermined pattern having a lateral gap in said second layer, thereby forming a groove defined by said gap and said surface of said first layer.

6. The method of claim 5 further comprising the step of providing a passageway through said substrate and said first layer to said gap in said second layer such that a heat transfer medium can be pumped into said groove.

7. The method of claim 5 wherein said second layer forming step further comprises the steps of screen printing said second layer to form a pattern of gaps and curing said second layer to form a pattern of grooves defined by said gaps and said surface of said first layer.

8. The method of claim 5 wherein said first and second insulating materials are the same material.

9. The method of claim 5 wherein said first and second insulating materials are different materials.

10. A method of fabricating an electrostatic chuck for retaining a workpiece, wherein said chuck contains a grooved surface, said method comprising the steps of:

forming a first layer of first insulating material upon a surface of a chuck body;

forming, upon a surface of said first layer, a second layer of second insulating material in a predetermined pattern having a lateral gap in said second layer; and said gap defines sides of a groove and said surface of said first layer defines a bottom of said groove.

11. The method of claim 10 wherein said step for forming said first layer further comprises the step of screen printing said first layer onto said chuck body.

12. The method of claim 10 wherein said step for forming said second layer further comprises the step of screen printing said second layer onto said first layer.

13. The method of claim 10 further comprising the step of providing a passageway through said chuck body and said first layer to said groove such that a heat transfer medium can be pumped into said groove.

14. The method of claim 10 wherein said first and second insulating materials are the same material.

15. The method of claim 10 wherein said first and second insulating materials are different materials.

16. The method of claim 10 wherein said chuck body comprises a substrate having a surface that supports an electrode, said surface and said electrode form the surface of the chuck body.

17. An electrostatic chuck for retaining a workpiece comprising:

a chuck body having a surface;

a layer of an insulating material disposed over said surface of said chuck body; and said layer having a lateral gap in a surface of said layer such that said gap defines sides of a groove and said surface of said chuck body defines a bottom of said groove, said surface of said layer is adapted to support said workpiece.

18. The electrostatic chuck of claim 17 further comprising a passageway through said chuck body to said groove such that a heat transfer medium can be pumped into said groove.

19. The electrostatic chuck of claim 18 further comprising a passageway through said chuck body to said groove such that a heat transfer medium can be provided to said groove.

20. The electrostatic chuck of claim 19 wherein said layer defines a plurality of grooves arranged in a pattern to uniformly distribute said heat transfer medium.

21. An electrostatic chuck for retaining a workpiece comprising:

a substrate;

an electrode disposed upon a surface of said substrate;

a first layer of a first insulating material disposed over said electrode and said surface of said substrate;

a second layer of a second insulating material disposed over a surface of said first layer; and said second layer having a lateral gap in a surface of said second layer such that said gap defines sides of a groove and said surface of said first layer defines a bottom of said groove, said second layer is adapted to support said workpiece.

22. The electrostatic chuck of claim 21 wherein said first and second insulating materials are the same material.

23. The electrostatic chuck of claim 21 wherein said first and second insulating materials are different materials.

24. The electrostatic chuck of claim 21 further comprising a passageway through said substrate and said first layer to said groove such that a heat transfer medium can be pumped into said groove.

25. The electrostatic chuck of claim 21 further comprising a passageway through said substrate and said first layer to said groove such that a heat transfer medium can be provided to said groove.

26. The electrostatic chuck of claim 25 wherein said first and second layers define a plurality of grooves arranged in a pattern to uniformly distribute said heat transfer medium.

* * * * *